US012628307B2

(12) United States Patent
Narayanan et al.

(10) Patent No.: US 12,628,307 B2
(45) Date of Patent: May 12, 2026

(54) PLUGGABLE LED BEZEL SYSTEM

(71) Applicant: Dell Products L.P., Round Rock, TX (US)

(72) Inventors: Padmanabhan Narayanan, Chennai (IN); Shree Rathinasamy, Georgetown, TX (US); Senthil Kumar Ganesan, San Ramon, CA (US)

(73) Assignee: Dell Products L.P., Round Rock, TX (US)

( * ) Notice: Subject to any disclaimer, the term of this patent is extended or adjusted under 35 U.S.C. 154(b) by 144 days.

(21) Appl. No.: 18/659,087

(22) Filed: May 9, 2024

(65) Prior Publication Data

US 2025/0351290 A1     Nov. 13, 2025

(51) Int. Cl.
H05K 5/00          (2025.01)
H05K 7/14          (2006.01)

(52) U.S. Cl.
CPC ................................. H05K 7/1494 (2013.01)

(58) Field of Classification Search
CPC .................................................... H05K 7/1494
See application file for complete search history.

(56) References Cited

U.S. PATENT DOCUMENTS

| | | | | |
|---|---|---|---|---|
| 3,969,721 | A * | 7/1976 | Chadwick | ............ H01H 13/023 |
| | | | | 340/815.45 |
| 10,491,422 | B2 * | 11/2019 | Teeter | ................. H04L 41/0816 |
| 2005/0094392 | A1 * | 5/2005 | Mooney | .............. H05K 1/0274 |
| | | | | 362/241 |
| 2011/0156595 | A1 * | 6/2011 | Sun | ...................... G02B 6/0088 |
| | | | | 362/382 |
| 2022/0334621 | A1 * | 10/2022 | O'Donnell | .......... G06F 11/3055 |
| 2024/0381513 | A1 * | 11/2024 | Narayanan | ............. H05B 47/18 |

* cited by examiner

*Primary Examiner* — Xanthia C Relford
(74) *Attorney, Agent, or Firm* — Joseph Mencher

(57)          ABSTRACT
A pluggable Light Emitting Device (LED) bezel device includes a bezel device chassis that defines a plurality of port apertures and that is configured to connect to a computing device such that each of the plurality of port apertures is located immediately adjacent a respective port included on the computing device. A plurality of LEDs are included on the bezel device chassis. At least one bezel device connector extends from the bezel device chassis and is configured to couple to an LED control system in the computing device when the bezel device chassis is connected to the computing device, and transmit LED control information received from the LED control system to cause at least one of the plurality of LEDs to illuminate.

20 Claims, 19 Drawing Sheets

200

212

202

202f

210

212

214

216

206

206

206

206

206

206

202a

206

206

202b

206

202c

206

202d

206

206

206

214

206

206

206

208

206

212

216

212

202e

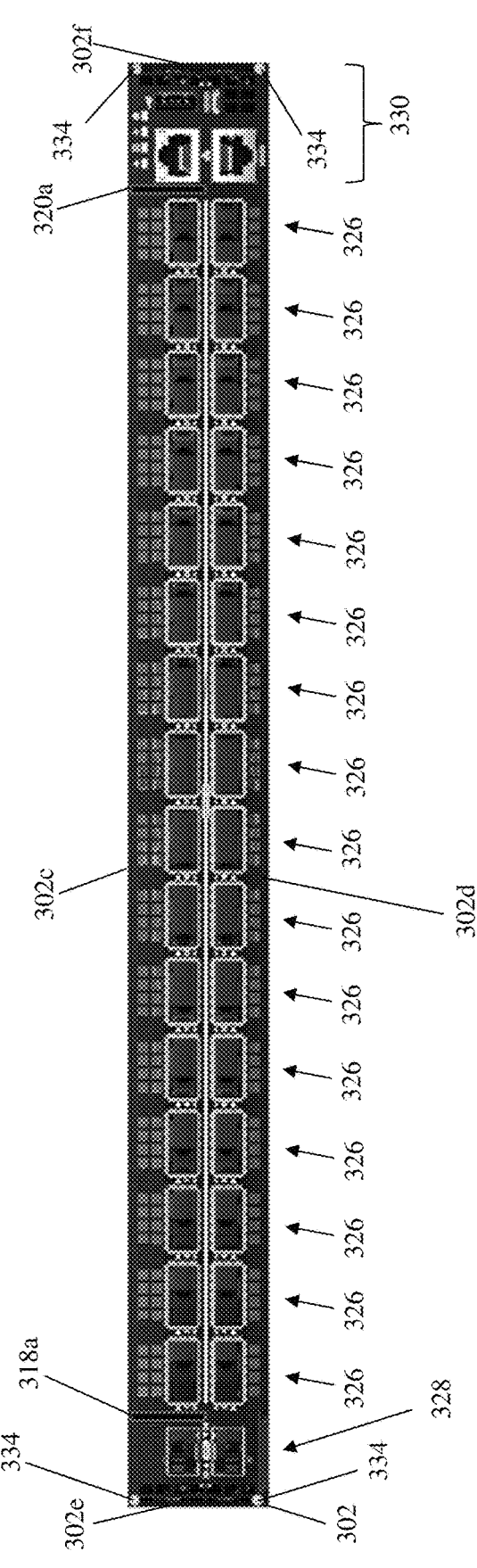
FIG. 3C

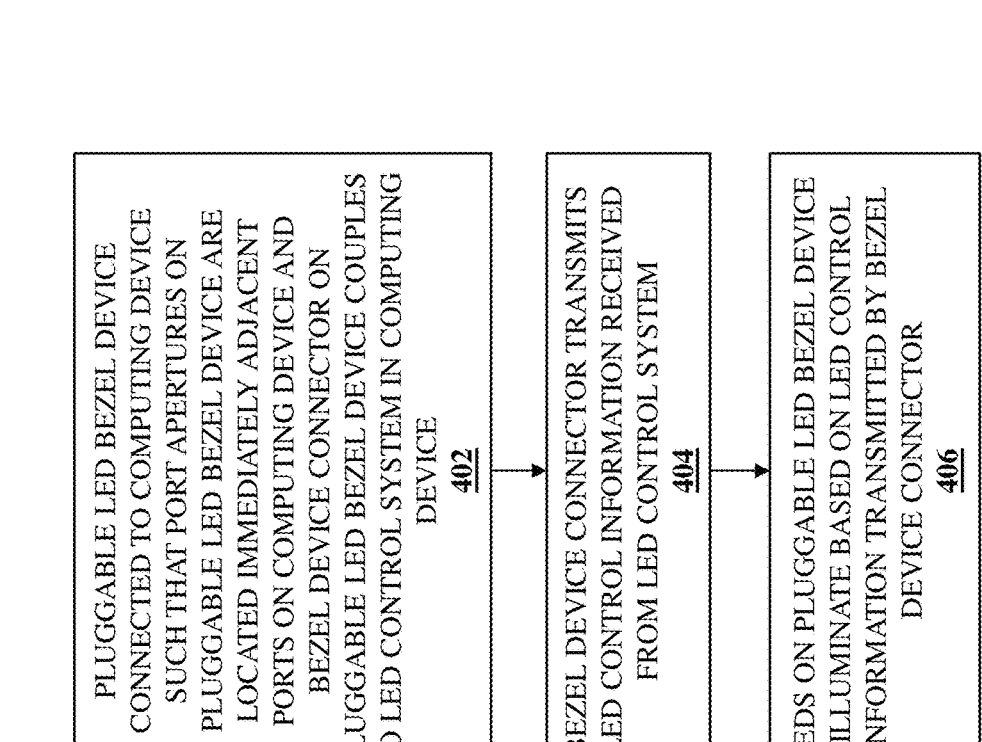

400

PLUGGABLE LED BEZEL DEVICE
CONNECTED TO COMPUTING DEVICE
SUCH THAT PORT APERTURES ON
PLUGGABLE LED BEZEL DEVICE ARE
LOCATED IMMEDIATELY ADJACENT
PORTS ON COMPUTING DEVICE AND
BEZEL DEVICE CONNECTOR ON
PLUGGABLE LED BEZEL DEVICE COUPLES
TO LED CONTROL SYSTEM IN COMPUTING
DEVICE
402

BEZEL DEVICE CONNECTOR TRANSMITS
LED CONTROL INFORMATION RECEIVED
FROM LED CONTROL SYSTEM
404

LEDS ON PLUGGABLE LED BEZEL DEVICE
ILLUMINATE BASED ON LED CONTROL
INFORMATION TRANSMITTED BY BEZEL
DEVICE CONNECTOR
406

FIG. 4

PLUGGABLE LED BEZEL SYSTEM

BACKGROUND

The present disclosure relates generally to information handling systems, and more particularly to a pluggable Light Emitting Device (LED) bezel for information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many Information handling systems such as, for example, conventional networking devices, include Light Emitting Device (LED) systems for use in displaying information associated with networking ports and/or other networking subsystems included on the networking device. For example, conventional networking devices often include a front panel or other outer surface having "system" LEDs (e.g., a power supply LED, a "master" LED, a fan LED, a "system" LED, a stack identifier LEDs, and/or other system LEDs known in the art) that are configured to display "system" information about the networking device using Field Programmable Gate Array (FPGA) registers, Complex Programmable Logic Device (CPLD) registers, and/or other processing subsystems in the switch device. Furthermore, the front panel or other outer surface on conventional networking devices will also include "switchport" LEDs that are configured to display "port" information (e.g., port link "up"/"down" information, port speed information, port activity information, etc.) about the ports on the networking device that may be received from, for example, a Network Processing Unit (NPU) Media Access Controller (MAC)/ Application-Specific Integrated Circuit (ASIC) via a CPLD that decodes and latches that port information for use in driving the switchport LEDs. The use of such conventional LED systems on networking devices raises a number of issues.

For example, the amount of time and effort dedicated to designing the LED system in the networking device (e.g., from both a hardware/CPLD perspective as well as a software/microcontroller code development and testing perspective) can be relatively significant, while the LEDs included on the networking devices discussed above are typically utilized during initial cabling of the networking device and following any subsequent port outage and/or cable maintenance, which when compared to the "up" time of the networking device is relatively insignificant. Furthermore, the LED configuration on the front panel or other outer surface of the networking device is finalized during initial product design such that it cannot be changed, thus constraining modifications to networking device design following that initial product design.

Further still, as networking devices are enabled with higher and higher speeds (e.g., currently available 400G port speeds, upcoming 800G port speeds, etc.), their ports will be capable of increasing "breakout" port densities (e.g., with a single 400G port capable of supporting 8 breakout connections, future 800G ports capable of supporting 16 breakout connections, etc.), but conventional LED systems only support 4 LEDs per port and thus are limited to displaying information associated with 4 breakout connections. Finally, LED systems compete for the available space on the front panel of (and within) the networking device, and thus can prevent heat dissipation features and/or other networking device features from being provided on the networking device, which can provide a constraint on the amount of power that may be consumed by the networking device in situations in which heat dissipation is limited.

One of the inventors of the present disclosure has developed systems and methods to address the issues discussed above. U.S. Pat. No. 11,818,233 issued Nov. 14, 2023, the disclosure of which is incorporated by reference herein in its entirety, describes a portable LED receiver developed by one of the inventors of the present disclosure that includes a plurality of LEDs and that may be paired with a network switch and then may operate to track the status of switch ports on that network switch using its LEDs, allowing disaggregation of LEDs from switch ports. U.S. patent application Ser. No. 18/196,059, filed May 11, 2023, the disclosure of which is incorporated by reference herein in its entirety, describes a networking device connectable LED system developed by one of the inventors of the present disclosure that includes a plurality of LEDs and that may be connected to a port on networking devices and have its LEDs illuminated to provide information about that networking device or its ports, thus allowing the LEDs to be removed from the front surface of that networking device.

However, conventional networking devices like those discussed above also often utilize LED(s) as locators/beacons that may be illuminated to allow a network administrator or other user to locate the networking device or any of its ports, and the removal of the LEDs from the front panel of the networking device and the provisioning of those LEDs on the portable LED receiver or networking device connectable LED system described above prevents (or limits) such locator/beacon functionality by physically separating the LEDs from the networking device and/or ports they would otherwise be used to locate.

Accordingly, it would be desirable to provide a networking device LED system that addresses the issues discussed above.

SUMMARY

According to one embodiment, an Information Handling System (IHS) includes an IHS chassis; a communication system in the IHS chassis that includes a plurality of ports that are accessible on a surface of the IHS chassis; a processing system in the IHS chassis that is coupled to the communication system; a memory system in the IHS chassis that is coupled to the processing system and that includes instructions that, when executed by the processing system, cause the processing system to provide an LED control engine; a bezel device chassis that is connected to the IHS chassis and that defines a plurality of port apertures that are each located immediately adjacent a respective one of the plurality of ports, wherein the bezel device chassis is configured to be disconnected from the IHS chassis; a plurality of Light Emitting Devices (LEDs) that are included on the bezel device chassis; and at least one bezel device connector that extends from the bezel device chassis, that is coupled to the processing system, and that is configured to transmit LED control information received from the LED control engine to cause at least one of the plurality of LEDs to illuminate, wherein the at least one bezel device connector is configured to be decoupled from the processing system when the bezel device chassis is disconnected from the IHS chassis.

BRIEF DESCRIPTION OF THE DRAWINGS

FIG. 3C is a front view illustrating an embodiment of the networking device of FIG. 3B.

FIG. 4 is a flow chart illustrating an embodiment of a method for providing device information using a pluggable LED bezel device.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
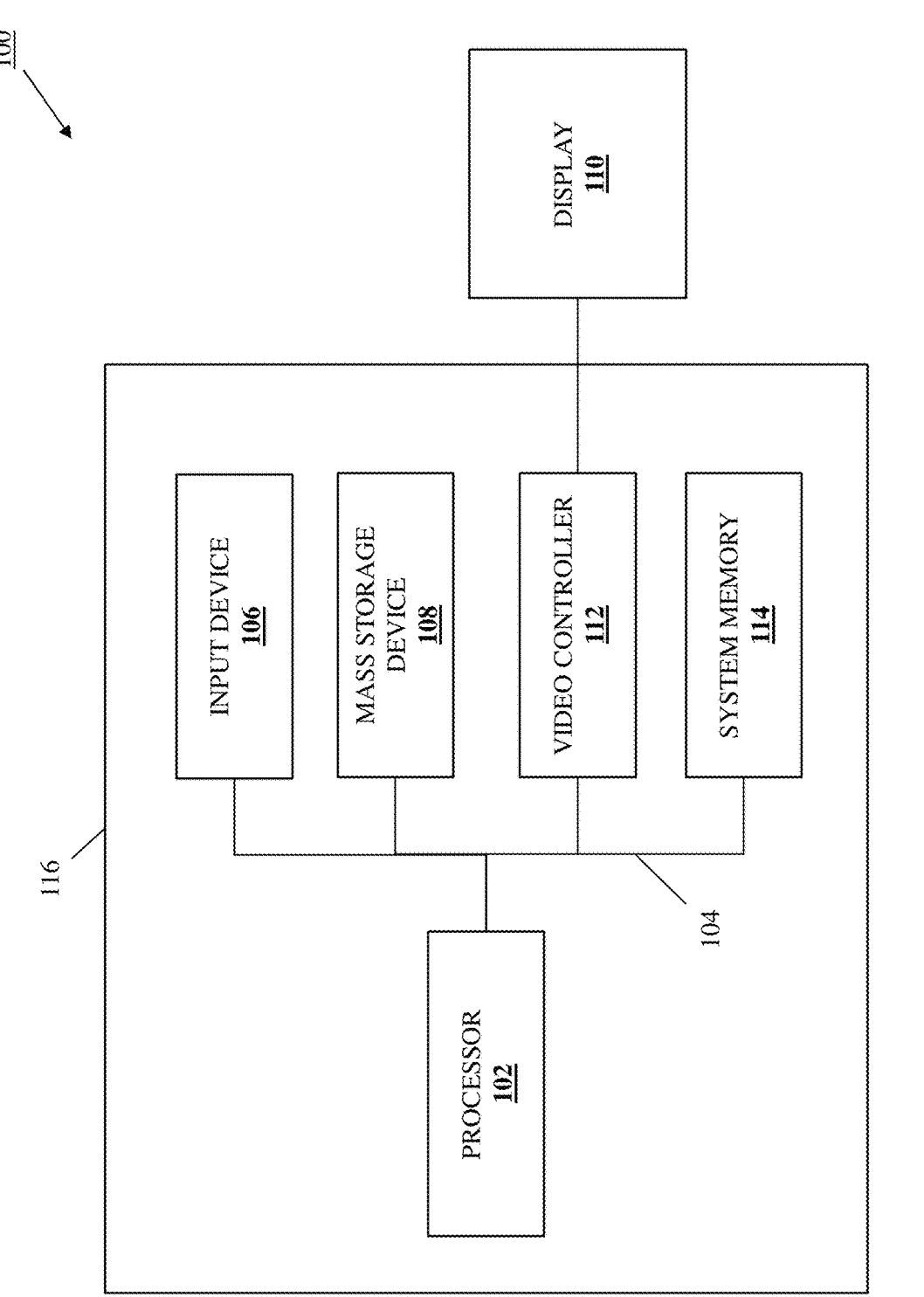
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
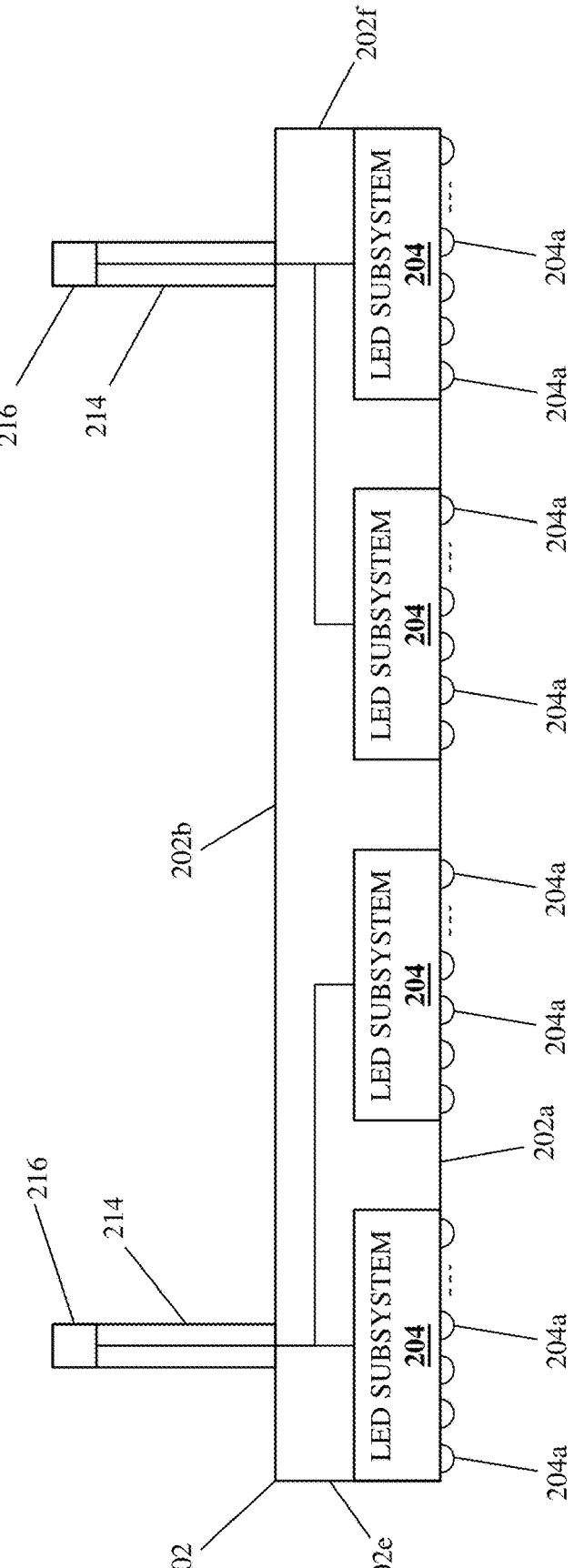
FIG. 2A is a schematic view illustrating an embodiment of a pluggable LED bezel device that may be provided according to the teachings of the present disclosure.
Figure 2B:
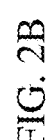
FIG. 2B is a perspective view illustrating an embodiment of the pluggable LED bezel device of FIG. 2A.
Figure 2C:
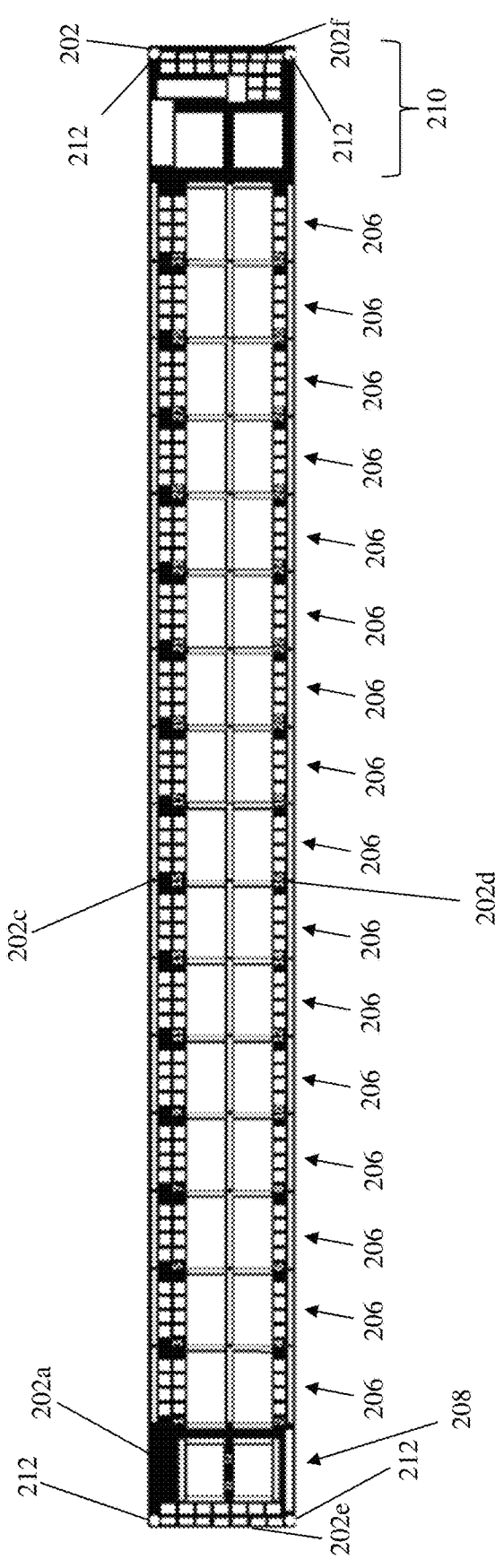
FIG. 2C is a front view illustrating an embodiment of the pluggable LED bezel device of FIG. 2B.

Referring now to FIGS. 2A, 2B, and 2C, an embodiment of a pluggable LED bezel device 200 is illustrated that may be provided according to the teachings of the present disclosure. In the illustrated embodiment, the pluggable LED bezel device 200 includes a bezel device chassis 202 that supports the components of the pluggable LED bezel device 200, only some of which are illustrated and described below. In the illustrated example, the chassis 202 includes a front surface 202a, a rear surface 202b that is located opposite the bezel device chassis 202 from the front surface 202a, a top edge 202c that extends between the front surface 202a and the rear surface 202b, a bottom edge 202d that is located opposite the bezel device chassis 202 from the top edge 202c and that extends between the front surface 202a and the rear surface 202b and, and a pair of opposing side edges 202e and 202f that are located opposite the bezel device chassis 202 from each other and that extend between the front surface 202a, the rear surface 202b, the top edge 202c, and the bottom edge 202d.

In the illustrated embodiment, a plurality of LED subsystems 204 are included in the bezel device chassis 202, with each LED subsystem 204 including a plurality of LEDs 204a. As will appreciated by one of skill in the art in possession of the present disclosure, the LED subsystems 204 may include LED Integrated Circuits (ICs) that are configured to drive the LEDs 204a, and those LED ICs may be located in the bezel device chassis 202 as illustrated, in the bezel device connectors 216, and/or in other locations that would be apparent to one of skill in the art in possession of the present disclosure. Furthermore, one of skill in the art in possession of the present disclosure will appreciate how the bezel device connectors 216 may include pinout mappings for power, ground, I2C (e.g., Serial Data (SDA), Serial Clock (SCL), etc.), and/or any other connections with a networking device that one of skill in the art in possession of the present disclosure would recognize as being required to provide the functionality described below.

While the specific examples illustrated and described below include four LED subsystems each having a plurality of LEDs, one of skill in the art in possession of the present disclosure will appreciate how a single LED subsystem, fewer than four LED subsystems, or more than four LED subsystems will fall within the scope of the present disclosure as well. As illustrated in FIGS. 2B and 2C, the bezel device chassis 202 may include a plurality of primary data port aperture sections 206, and one of skill in the art in possession of the present disclosure will appreciate how the primary data port aperture sections 206 of the illustrated embodiment are configured to be provided adjacent primary data ports on a networking device that connect to computing devices and provide for the transmission of data between those computing devices.

Figure 2D:
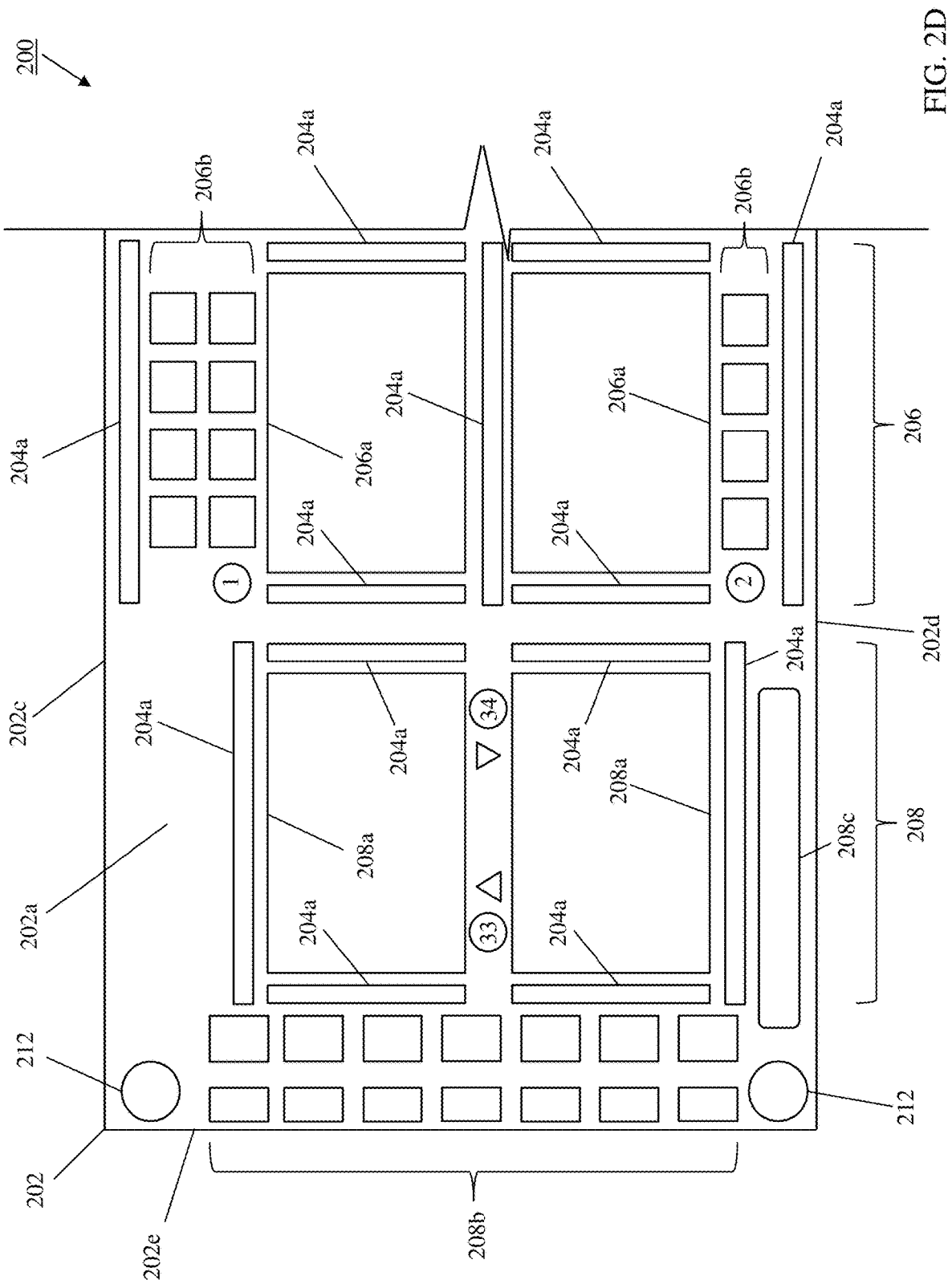
FIG. 2D is a front view illustrating an embodiment of a portion of the pluggable LED bezel device of FIGS. 2A-2C.

As illustrated in FIG. 2D, the primary data port aperture sections 206 may each include a pair of port apertures 206a that are defined by the bezel device chassis 202 such that they extend from the front surface 202a to the rear surface 202b in a "stacked" orientation (i.e., with a "1" port aperture positioned "on top" of a "2" port aperture visible in FIG. 2D), four LEDs 204a positioned about the perimeter of each of the port apertures 206a (e.g., an elongated LED located substantially along the length of each side of its adjacent port aperture 206a), and a plurality of airflow apertures 206b that are defined by the bezel device chassis 202 such that they extend from the front surface 202a to the rear surface 202b (e.g., with one set of airflow apertures 206b located between the "1" port aperture and the LED 204a adjacent its "top" edge in the illustrated example, and another set of airflow apertures 206b located between the "2" port aperture and the LED 204a adjacent its "bottom" edge in the illustrated example). Furthermore, in some embodiments, port numbers (e.g., "1" and "2" in FIG. 2D) may be backlit by LEDs as well.

While not illustrated or described in detail, one of skill in the art in possession of the present disclosure will appreciate how the other primary data port aperture sections 206 on the bezel device chassis 202 may be similar to the primary data port section 206 illustrated and described with reference to FIG. 2D, but with the "1/2" port apertures replaced with the "3/4" port apertures, the "5/6" port apertures, the "7/8" port apertures, the "9/10" port apertures, the "11/12" port apertures, the "13/14" port apertures, the "15/16" port apertures, the "17/18" port apertures, the "19/20" port apertures, the "21/22" port apertures, the "23/24" port apertures, the "25/26" port apertures, the "27/28" port apertures, the "29/30" port apertures, and the "31/32" port apertures.

In the illustrated embodiment, the bezel device chassis 202 also includes an uplink data port section 208, and one of skill in the art in possession of the present disclosure will appreciate how the uplink data port section 208 of the illustrated embodiment is configured to be provided adjacent uplink data ports on a networking device that connect that networking device to other networking devices to enable the transmission of data between computing devices. As illustrated in FIG. 2D, the uplink data port section 208 may include a pair of port apertures 208a that are defined by the bezel device chassis 202 such that they extend from the front surface 202a to the rear surface 202b in a "stacked" orientation (i.e., with a "33" port aperture positioned "on top" of a "34" port aperture visible in FIG. 2D), three LEDs 204a positioned about the perimeter of each of the port apertures 406a (e.g., an elongated LED located substantially along the length of three side of its adjacent port aperture 208a), a plurality of airflow apertures 208b that are defined by the bezel device chassis 202 such that they extend from the front surface 202a to the rear surface 202b (e.g., with the airflow apertures 208b located between the side edge 202e of the bezel device chassis 202 and the LEDs 204a on the "left" sides of the port apertures 208a), and a luggage tag aperture 208c that is defined by the bezel device chassis 202 such that it extends from the front surface 202a to the rear surface 202b. Furthermore, in some embodiments, port numbers (e.g., "33" and "34" in FIG. 2D) may be backlit by LEDs as well.

Figure 2E:
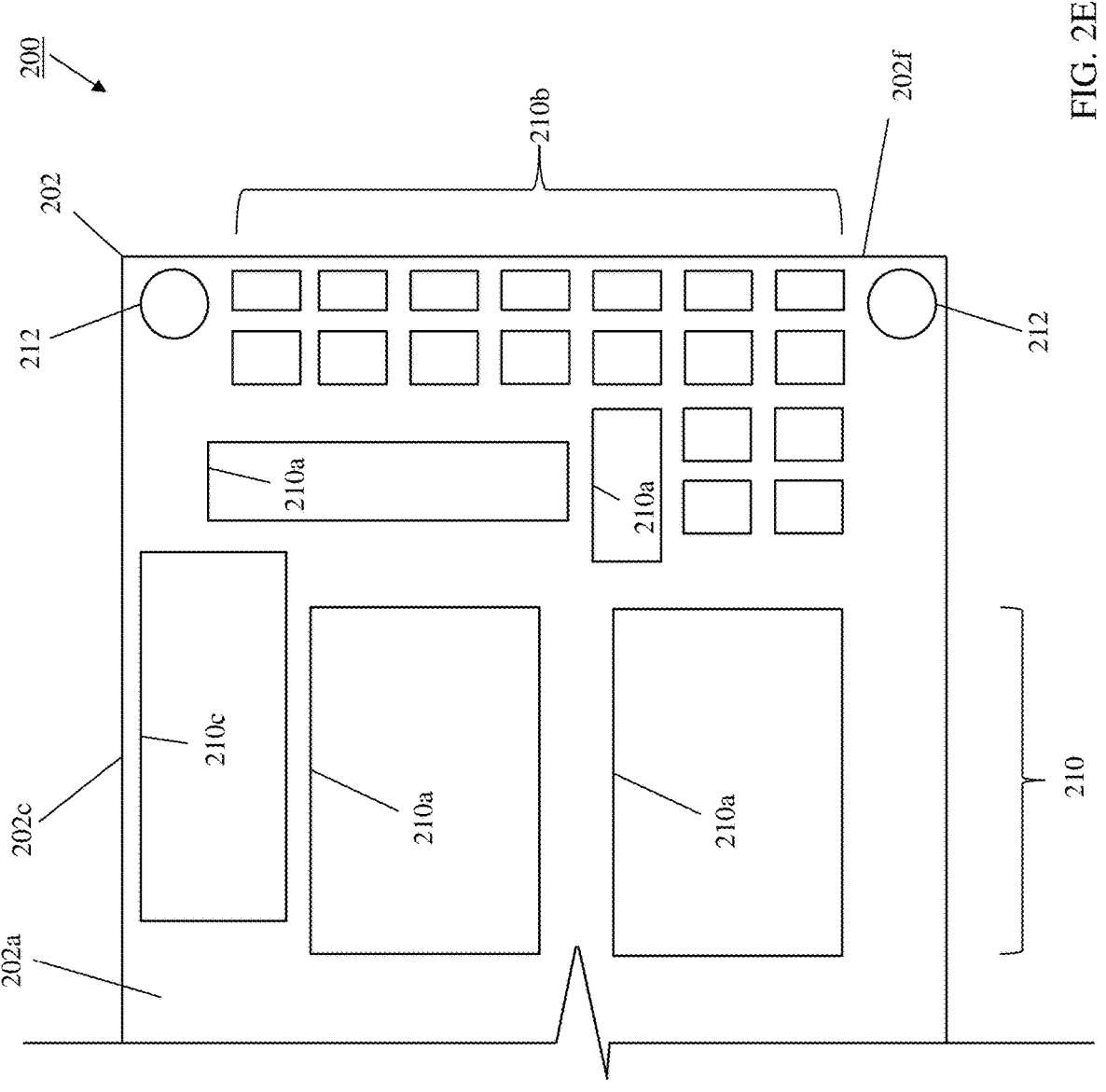
FIG. 2E is a front view illustrating an embodiment of a portion of the pluggable LED bezel device of FIGS. 2A-2C.

In the illustrated embodiment, the bezel device chassis 202 also includes a management data port section 210, and one of skill in the art in possession of the present disclosure will appreciate how the management data port section 206 of the illustrated embodiment is configured to be provided adjacent management data ports that operate to connect management devices to networking devices and enable the management of networking devices that transmits data between computing devices. As illustrated in FIG. 2E, the management data port section 210 may include four port apertures 210a that are defined by the bezel device chassis 202 such that they extend from the front surface 202a to the rear surface 202b, and as described below two of the port apertures 210a may be provided for an Ethernet console data port and a Universal Serial Bus (USB) console data port, one of the port apertures 210a may be provided for USB port, and one of the port apertures 210a may be provided for a Ethernet management port. A plurality of airflow apertures 210b are defined by the bezel device chassis 202 such that they extend from the front surface 202a to the rear surface 202b (e.g., with the airflow apertures 210b located between the side edge 202f of the bezel device chassis 202 and the port apertures 210a). In the specific example provided herein, a system LED aperture 210c is defined by the bezel device chassis 202 such that it extends from the front surface 202a to the rear surface 202b, and in embodiments in which networking devices include system LEDs, is configured to allow those system LEDs to be seen through the bezel device chassis 202.

A plurality of bezel device chassis mounting apertures 212 are defined by the bezel device chassis 202 such that they extend from the front surface 202a to the rear surface 202b, and in the illustrated embodiment include a respective bezel device chassis mounting aperture 212 located at each corner of the bezel device chassis 202. In the illustrated embodiment, the pluggable LED bezel device 200 includes a bezel device guide subsystem that, in the illustrated embodiment, includes a pair of bezel device guide members 214 that extend from the rear surface 202b of the bezel device chassis 202 on opposite sides of the bezel device chassis 202. Furthermore, in the illustrated example, a respective bezel device connector 216 is located on a distal end of each of the bezel device guide members 214 opposite the bezel device chassis 202, and each of the respective bezel device connectors 216 may be coupled to a subset of the LED subsystems 204 as illustrated in FIG. 2A.

As such, in the illustrated examples, the bezel device guide subsystem is illustrated as being provided by a pair of circuit boards that extend from the bezel device chassis 202 to provide the bezel device guide members 214, and that include the bezel device connectors 216 on their distal ends opposite the bezel device chassis 202. However, while a pair of bezel device connectors included on respective bezel device guide members and coupled to subsets of LED subsystems is illustrated and described herein, one of skill in the art in possession of the present disclosure will appreciate how a single bezel device connector may be provided on one of the bezel device guide members and may be coupled to each LED subsystem in the bezel device chassis while remaining within the scope of the present disclosure as well. As such, while a specific pluggable LED bezel device 200 has been illustrated and described, one of skill in the art in possession of the present disclosure will recognize that the pluggable LED bezel device of the present disclosure may include a variety of components and component configurations while remaining within the scope of the present disclosure as well.

For example, one of skill in the art in possession of the present disclosure will appreciate how the pluggable LED bezel device 200 may be provided with a variety of components and/or a variety of configurations depending on the computing device with which it will be used, and depending on the LED (and other) functionality desired. As such, a pluggable LED bezel device manufacturer may provide several different pluggable LED bezel devices that are configured to connect to the same computing device (i.e., different pluggable LED bezel devices may be provided for the same computing device "platform"), and a user of that computing device may select the pluggable LED bezel device they wish to use based on the functionality they required.

Furthermore, any computing device developed for used with a pluggable LED bezel device may have its "front wall" dimensions and features captured (e.g., during manufacturing of the computing device) for use in manufacturing the pluggable LED bezel device(s) that will be available for use with it. As such, "x,y" positions of ports (e.g., the primary data ports, uplink ports, management ports, etc., discussed above), airflow apertures and other heat dissipation features, system LEDs, "luggage tags" that include information about the computing device printed thereon, and/or any other features on the "front wall" of the computing device may be captured and used to manufacture the pluggable LED bezel device in order to provide features like those on the pluggable LED bezel device 200 discussed above with reference to FIGS. 2A-2E. Further still, those "front wall" dimensions and features may be provided to users of computing devices or vendors of pluggable LED bezel devices in a manner that is configured to allow 3D printing of the bezel device chassis 202 using any of a variety of 3D printing techniques known in the art, with the LED subsystems and bezel device connector(s) made available for connection to the 3D printed bezel device chassis in order to allow the creation and customization of pluggable LED bezel devices for computing devices as desired.

Figure 3A:
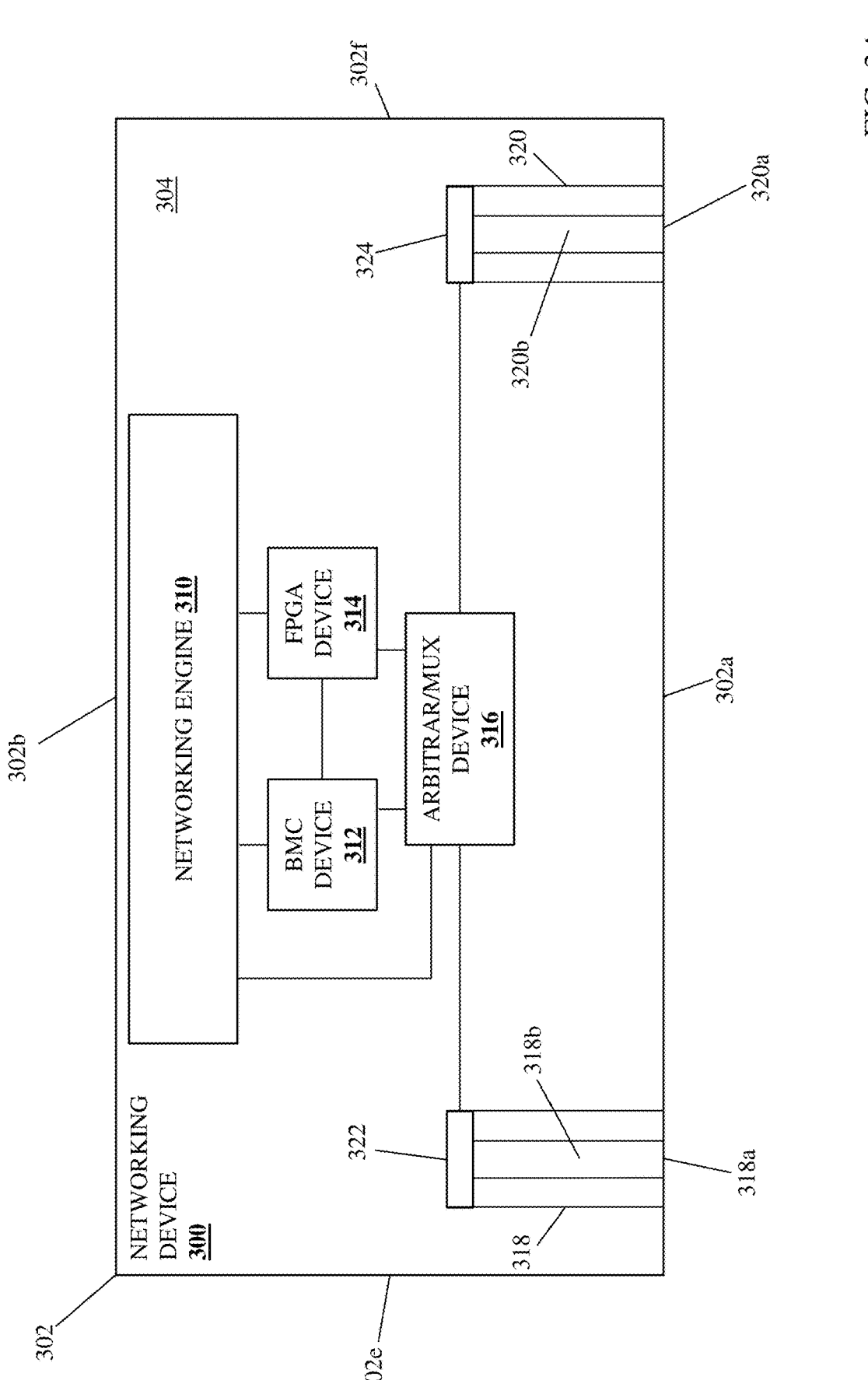
FIG. 3A is a schematic view illustrating an embodiment of a networking device that may be used with the pluggable LED bezel device of FIG. 2A.
Figure 3B:
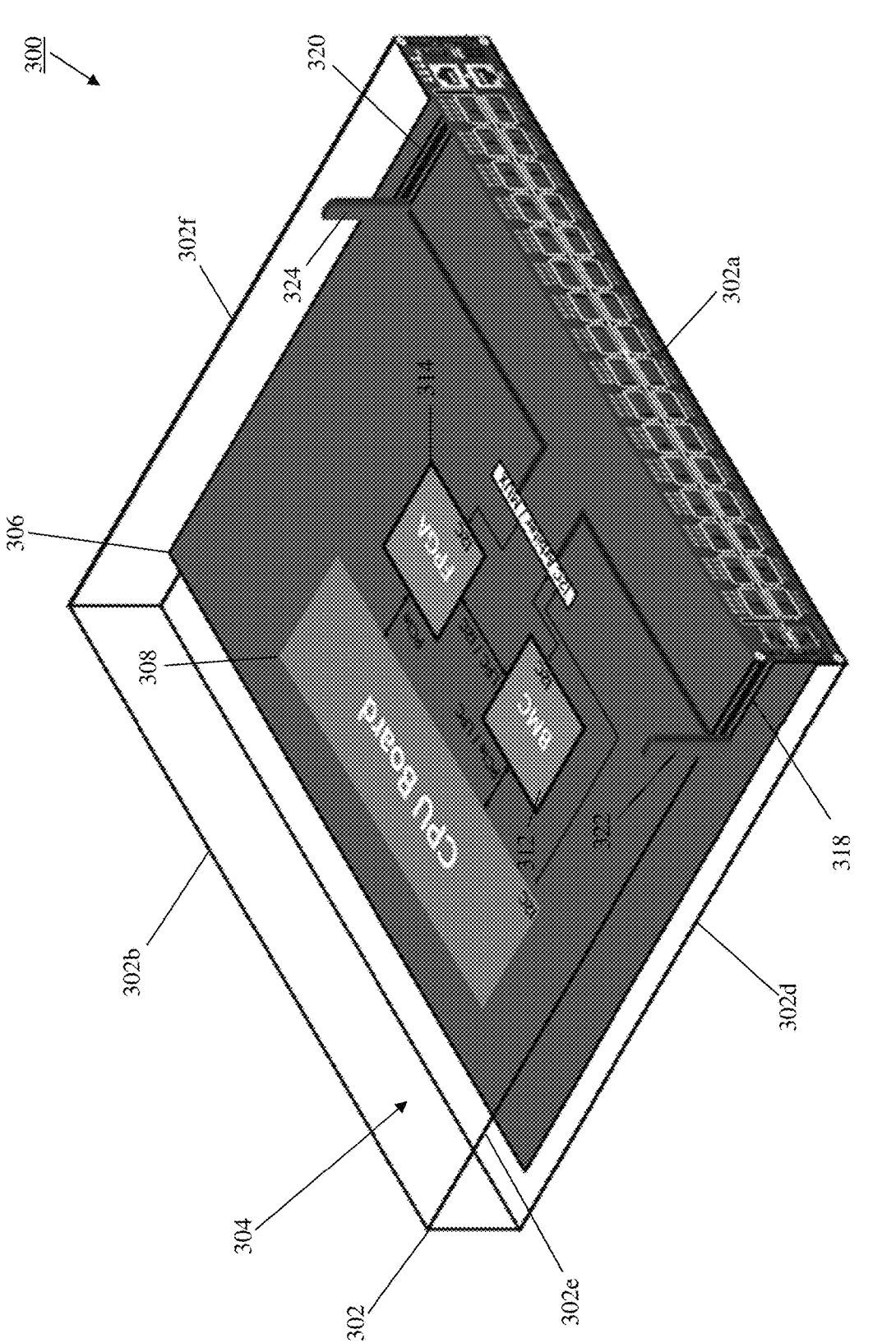
FIG. 3B is a perspective view illustrating an embodiment of the networking device of FIG. 3A.

Referring now to FIGS. 3A, 3B, and 3C, an embodiment of a networking device 300 is illustrated that may be used with the pluggable LED bezel device 200 of FIGS. 2A-2E. In an embodiment, the networking device 300 may be provided by the IHS 100 discussed above with reference to FIG. 1 and/or may include some or all of the components of the IHS 100, and in the specific examples below is illustrated and described as being provided by a switch device. However, while illustrated and discussed as being provided by a specific networking device, one of skill in the art in possession of the present disclosure will recognize that the functionality of the networking device 300 discussed below may be provided by other computing devices (e.g., server devices, storage systems, etc.) that are configured to operate similarly as the networking device 300 discussed below.

In the illustrated embodiment, the networking device 300 includes a networking device chassis 302 that houses the components of the networking device 300, only some of which are illustrated and described below. In the illustrated embodiment, the networking device chassis 302 includes a front wall 302a, a rear wall 302b that is located opposite the networking device chassis 302 from the front wall 302a, a top wall 302c that extends between the front wall 302a and the rear wall 302b, a bottom wall 302d that extends between the front wall 302a and the rear wall 302b and that is located opposite the networking device chassis 302 from the top wall 302c, and a pair of opposing side walls 302e and 302f that extend between the front wall 302a, the rear wall 302b, the top wall 302c, and the bottom wall 302d, and that are located opposite the networking device chassis 302 from each other. A networking device chassis housing 304 is defined between the front wall 302a, the rear wall 302b, the top wall 302c, the bottom wall 302d, and the side walls 302e and 302f, and houses the components of the networking device 300.

For example, the chassis 302 may house a circuit board 306 (e.g., a motherboard) that is mounted to the bottom wall 302d of the networking device chassis 302 in the networking device chassis housing 304, and that supports the components of the networking device 300. As will be appreciated by one of skill in the art in possession of the present disclosure, the networking device 300 may be provided with an LED control system that may include a variety of components that are configured to control LEDs. In the illustrated embodiment, the LED control system includes a processing system 308 (e.g., the Central Processing Unit (CPU) board in FIG. 3B) that may be provided on the circuit board 306 and that may be coupled to a memory system (not illustrated, but which may be similar to the memory 114 discussed above with reference to FIG. 1 and may be provided on or coupled to the CPU board illustrated in FIG. 3B) that includes instructions that, when executed by the processing system, cause the processing system to provide a networking engine 310 that is configured to perform the LED control functionality (as well as any conventional networking operations known in the art) of the networking engines and/or networking devices discussed below.

As illustrated, the LED control system may also include a Baseboard Management Controller (BMC) device 312 that may be provided on the circuit board 306 and that may be coupled to the processing system 308/networking engine 310 (e.g., via a Peripheral Component Interconnect express (PCIe) bus, a Low Pin Count (LPC) bus, and/or via other couplings that would be apparent to one of skill in the art in possession of the present disclosure). Furthermore, the LED control system may also include a Field Programmable Gate Array (FPGA) device 314 that may be provided on the circuit board 306 and that may be coupled to the processing system 308/networking engine 310 (e.g., via a PCIe bus and/or via other couplings that would be apparent to one of skill in the art in possession of the present disclosure), and that may be coupled to the BMC device 312 (e.g., via an LPC bus, an Inter-Integrated Circuit (I2C) bus, and/or via other couplings that would be apparent to one of skill in the art in possession of the present disclosure). Further still, the LED control system may also include an arbitrar/multiplexer (MUX) device 316 that may be provided on the circuit board 306 and that may be coupled to the processing system 308/networking engine 310, the BMC device 312, and the FPGA device 314 (e.g., via an I2C bus and/or via other couplings that would be apparent to one of skill in the art in possession of the present disclosure).

The networking device chassis 302 also includes a networking device guide subsystem that, in the specific examples illustrated and described below, includes a pair of networking device guide members 318 and 320 that each extend from the front wall 302a of the networking device chassis 302 on opposite sides of the front wall 302a adjacent the side walls 302e and 302f, respectively, that each include a bezel device connector slot 318a and 320a, respectively, defined by and extending through the front wall 302a of the networking device chassis 302, and that each include a bezel device connector channel 318b and 320b, respectively, extending from that bezel device connector slot 318a and 320a, respectively.

Furthermore, a networking device connector 322 is included on or located adjacent to the networking device guide member 318 and coupled to the arbitrar/MUX device 316 (e.g., via an I2C bus and/or via other couplings that would be apparent to one of skill in the art in possession of the present disclosure), and a networking device connector 324 is included on or located adjacent to the networking device guide member 320 and coupled to the arbitrar/MUX device 316 (e.g., via an I2C bus and/or via other couplings that would be apparent to one of skill in the art in possession of the present disclosure). However, similarly as described above, while a pair of networking device connectors included on or adjacent respective networking device guide members and coupled to the arbitrar/MUX device 316 are illustrated and described herein, one of skill in the art in possession of the present disclosure will appreciate how a single networking device connector may be provided on or adjacent to one of the networking device guide members and may be coupled to the arbitrar/MUX device 316 while remaining within the scope of the present disclosure as well.

Figure 3D:
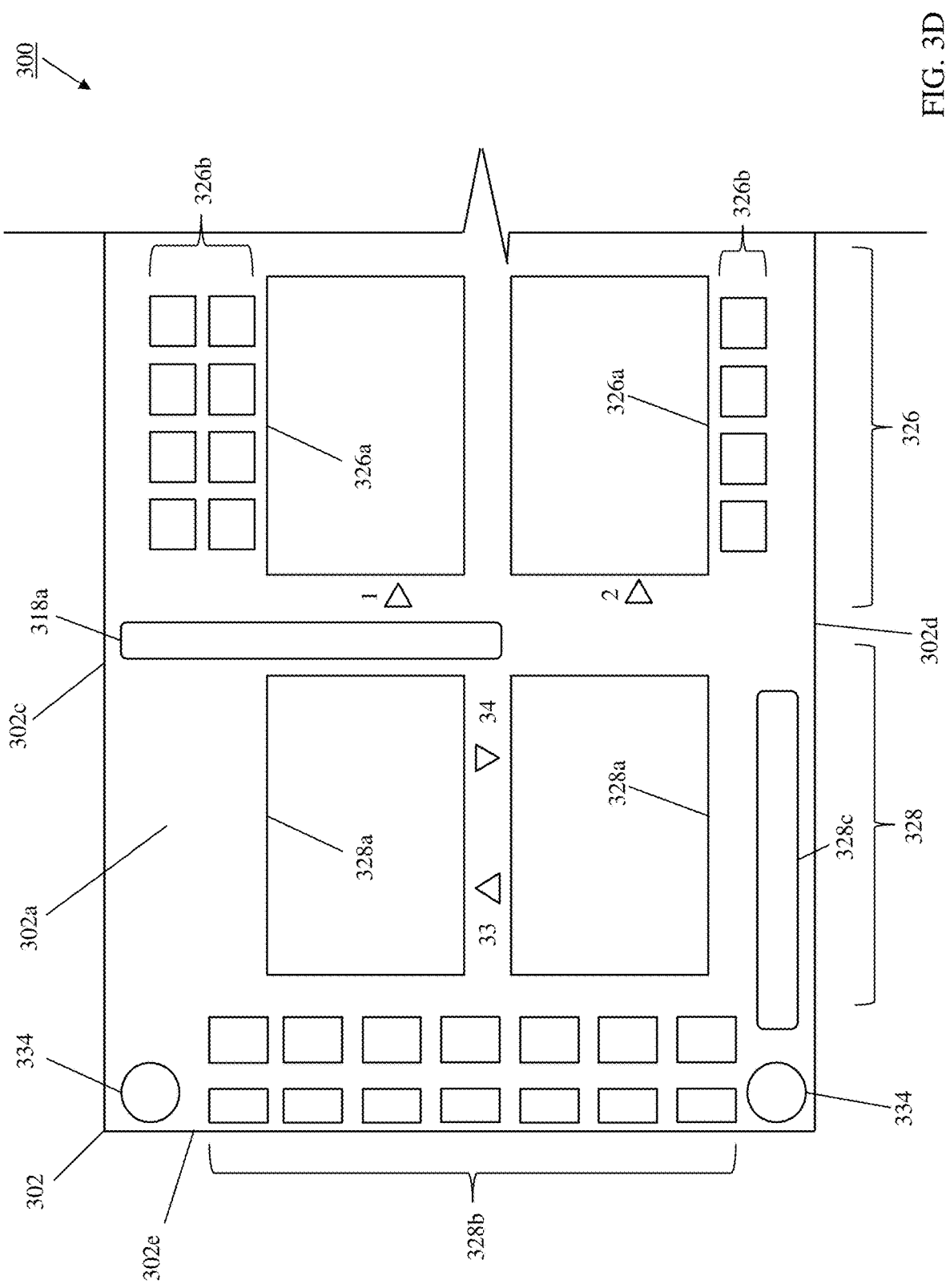
FIG. 3D is a front view illustrating an embodiment of a portion of the networking device of FIGS. 3A-3C.
Figure 3E:
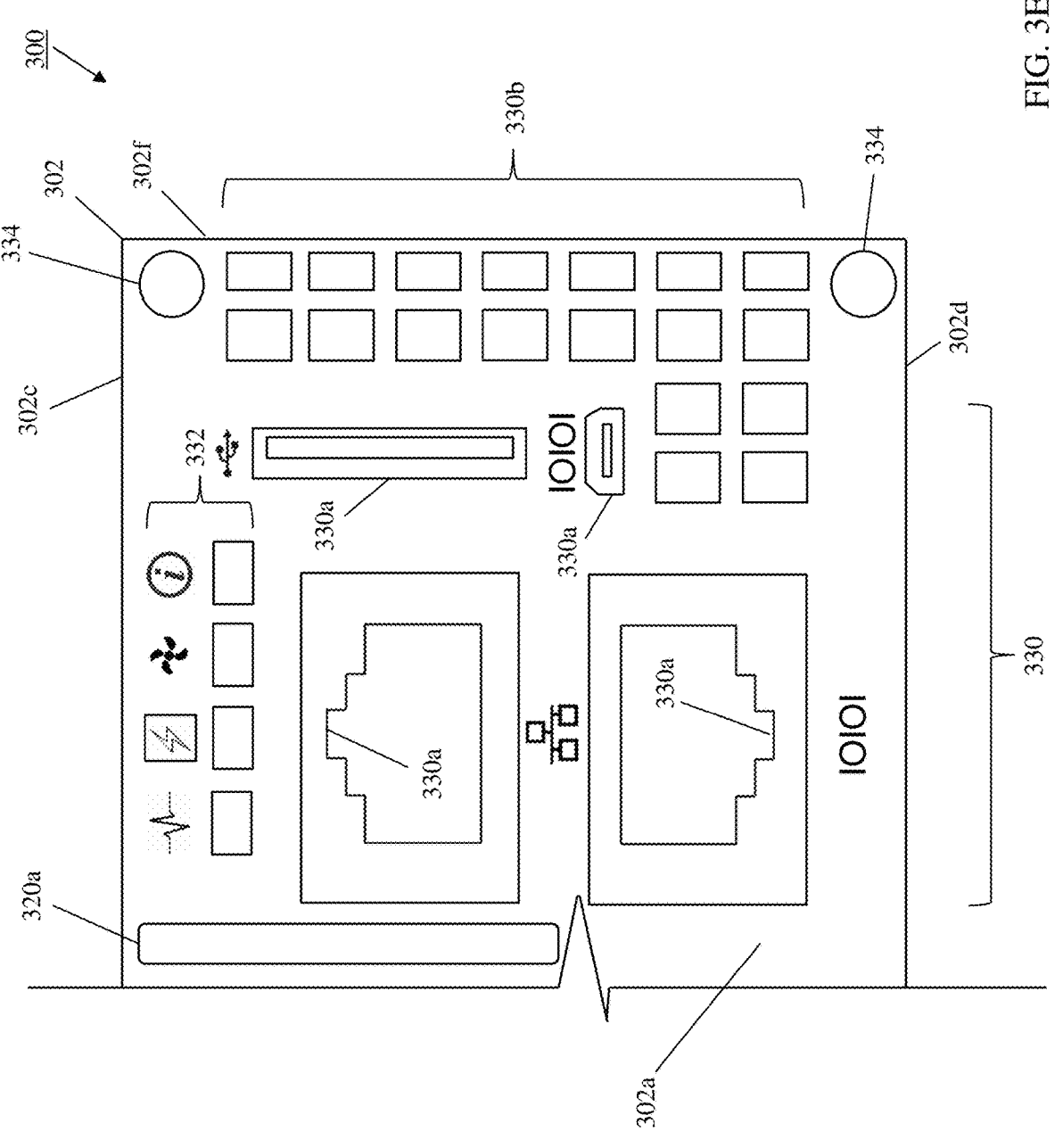
FIG. 3E is a front view illustrating an embodiment of a portion of the networking device of FIGS. 3A-3C.

As illustrated in FIGS. 3C, 3D, and 3E, the front wall 302a of the networking device chassis 302 may include a plurality of primary data port sections 326 that each include a pair of primary data ports 326a that are configured to connect to computing devices and provide for the transmission of data between those computing device. In the specific examples provided herein, the primary data ports 326a are provided in a "stacked" orientation (i.e., with a "1" primary data port positioned "on top" of a "2" primary data port visible in FIG. 3D), and a plurality of airflow apertures 326b are defined by and extend through the front wall 302a of the networking device chassis 302 to the networking device chassis housing 304 (e.g., with one set of airflow apertures 326b located between the "1" primary data port and the top wall 302c of the networking device chassis 302 in the illustrated example, and another set of airflow apertures 326b located between the "2" primary data port and the bottom wall 302d of the networking device chassis 302 in the illustrated example). As will be appreciated by one of skill in the art in possession of the present disclosure, the airflow apertures 326b illustrated in FIG. 3D may be provided in place of LEDs that are typically included on conventional networking devices adjacent their ports.

While not illustrated or described in detail, one of skill in the art in possession of the present disclosure will appreciate how the other primary data port sections 326 on the networking device chassis 302 may be similar to the primary data port section 326 illustrated and described with reference to FIG. 3D, but with the "1/2" primary data ports replaced with the "3/4" primary data ports, the "5/6" primary data ports, the "7/8" primary data ports, the "9/10" primary data ports, the "11/12" primary data ports, the "13/14" primary data ports, the "15/16" primary data ports, the "17/18" primary data ports, the "19/20" primary data ports, the "21/22" primary data ports, the "23/24" primary data ports, the "25/26" primary data ports, the "27/28" primary data ports, the "29/30" primary data ports, and the "31/32" primary data ports.

In the illustrated embodiment, the networking device chassis 302 also includes an uplink data port section 328 that includes a pair of uplink data ports 328a that are configured to connect the networking device 300 to other networking devices to enable the transmission of data between computing devices. In the specific examples provided herein, the uplink data ports 328a are provided in a "stacked" orientation (i.e., with a "33" uplink data port positioned "on top" of a "34" uplink data port visible in FIG. 3D), a plurality of airflow apertures 328b are defined by and extend through the front wall 302a of the networking device chassis 302 to the networking device chassis housing 304 (e.g., with the airflow apertures 328b located between the uplink data ports 328a and the side wall 302e of the networking device chassis 302 in the illustrated example), and a luggage tag 328c is provided (e.g., located between the uplink data ports 328a and the bottom wall 302d of the networking device chassis 302) that one of skill in the art in possession of the present disclosure will appreciate may be removable from the networking device 300 and may include any of a variety of identification information about the networking device 300 printed or otherwise provided thereon.

In the illustrated embodiment, the networking device chassis 302 also includes a management data port section 330 that includes four management data ports 330a that operate to connect management devices to the networking device 300 and enable the management of the networking device 300. In the specific example illustrated in FIG. 3E, the management data port section 330 includes an Ethernet console data port and a USB console data port (a micro-USB console data port in the illustrated embodiment), a USB port, and an Ethernet management port, although one of skill in the art in possession of the present disclosure will appreciate how any of a variety of management data ports will fall within the scope of the present disclosure as well.

A plurality of airflow apertures 330b are defined by and extend through the front wall 302a of the networking device chassis 302 to the networking device chassis housing 304 (e.g., with the airflow apertures 330b located between the management data ports and the side wall 302f of the networking device chassis 302 in the illustrated example). In the illustrated embodiment, a plurality of system LEDs 332 are included on the front wall 302a of the networking device chassis 302 between the management data ports 330a and the top wall 302c of the networking device chassis 302, and one of skill in the art in possession of the present disclosure will appreciate how the illustrated embodiments of the present disclosure may keep the system LEDs on the front wall of the networking device chassis 302 due to those system LEDs being relatively important during the operation of the networking device and/or being used more frequently than the port LEDs that are typically included on conventional networking devices. However, one of skill in the art in possession of the present disclosure will appreciate how the system LEDs on a computing device may be removed from that computing device and provided on the pluggable LED bezel system of the present disclosure while remaining within the scope of the present disclosure as well. A plurality of networking device chassis mounting apertures 334 are defined by and extend into the front wall 302a of the networking device chassis 302, and in the illustrated embodiment include a respective networking device chassis mounting aperture 334 located at each corner of the networking device chassis 302.

As discussed above, networking devices may be provided with a variety of components and/or a variety of configurations other than those illustrated in FIGS. 3A-3E, and pluggable LED bezel device manufacturer(s) may provide pluggable LED bezel devices for any of those networking devices. Furthermore, any of those networking devices may have its "front wall" dimensions and features captured (e.g., during manufacturing of that networking device) for use in manufacturing the pluggable LED bezel devices that will be available for use with it. As such, "x,y" positions of the features of the port sections (e.g., the primary data ports, uplink ports, management ports, etc., discussed above), airflow apertures and other heat dissipation features, system LEDs, "luggage tags" that include information about the computing device printed thereon, and/or any other features on the "front wall" of the networking device 300 may be captured and used to manufacture the pluggable LED bezel device of the present disclosure that allows access to those features discussed above with reference to FIGS. 3A-3E when connected to the networking device 300.

Further still, those "front wall" dimensions and features may be provided to users of networking devices and/or vendors of pluggable LED bezel devices in a manner that is configured to allow the 3D printing of the bezel device chassis 202 discussed above with reference to FIGS. 2A-2E using any of a variety of 3D printing techniques known in the art, with the LED subsystems and bezel device connector(s) made available for connection to the 3D-printed bezel device chassis in order to allow the creation and customization of pluggable LED bezel devices for the networking device 300 as desired. As such, while a specific networking device 300 has been illustrated and described, one of skill in the art in possession of the present disclosure will appreciate how networking devices or other computing devices provided according to the teachings of the present disclosure may include a variety of components and/or configurations while remaining within the scope of the present disclosure as well.

Referring now to FIG. 4, an embodiment of a method 400 for providing device information using a pluggable Light Emitting Device (LED) bezel device is illustrated. As discussed below, the systems and methods of the present disclosure provide a pluggable LED bezel device that may be connected to a networking device to provide the LEDs for that networking device adjacent corresponding ports on that networking device, and then disconnected from that networking device when those LEDs are not needed. For example, the pluggable LED bezel device of the present disclosure may include a bezel device chassis that defines a plurality of port apertures and that is configured to connect to a computing device such that each of the plurality of port apertures is located immediately adjacent a respective port included on the computing device. A plurality of LEDs are included on the bezel device chassis. At least one bezel device connector extends from the bezel device chassis and is configured to couple to an LED control system in the computing device when the bezel device chassis is connected to the computing device, and transmit LED control information received from the LED control system to cause at least one of the plurality of LEDs to illuminate. As such, LEDs may be removed from networking devices to open up space for other networking device features (e.g., airflow apertures), eliminating the time required to develop and test networking-device-integrated LED subsystems, and providing other benefits that would be apparent to one of skill in the art in possession of the present disclosure.

Figure 5A:
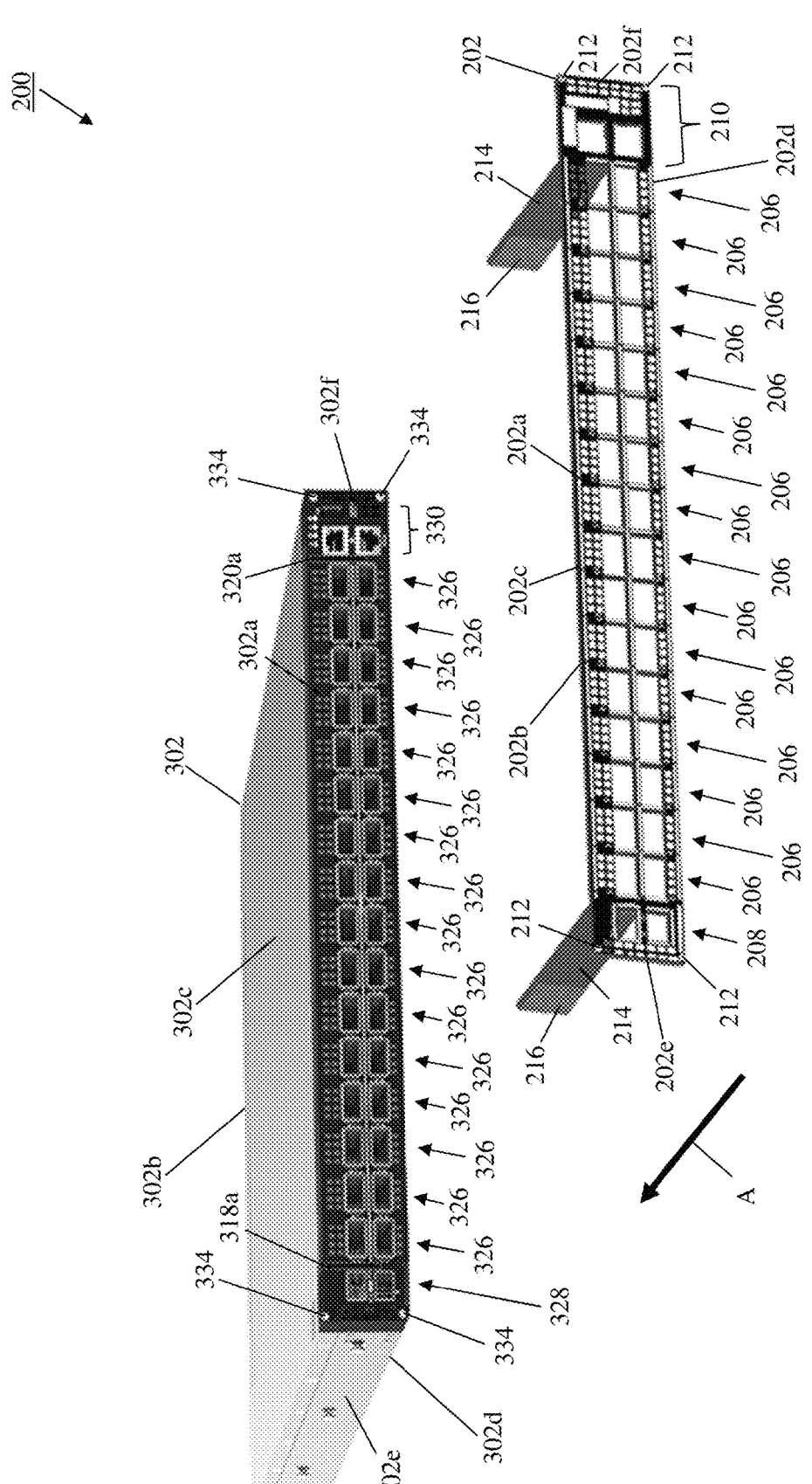
FIG. 5A is a perspective view illustrating an embodiment of the pluggable LED bezel device of FIGS. 2B and 2C being coupled to the networking device of FIGS. 3B and 3C.
Figure 5B:
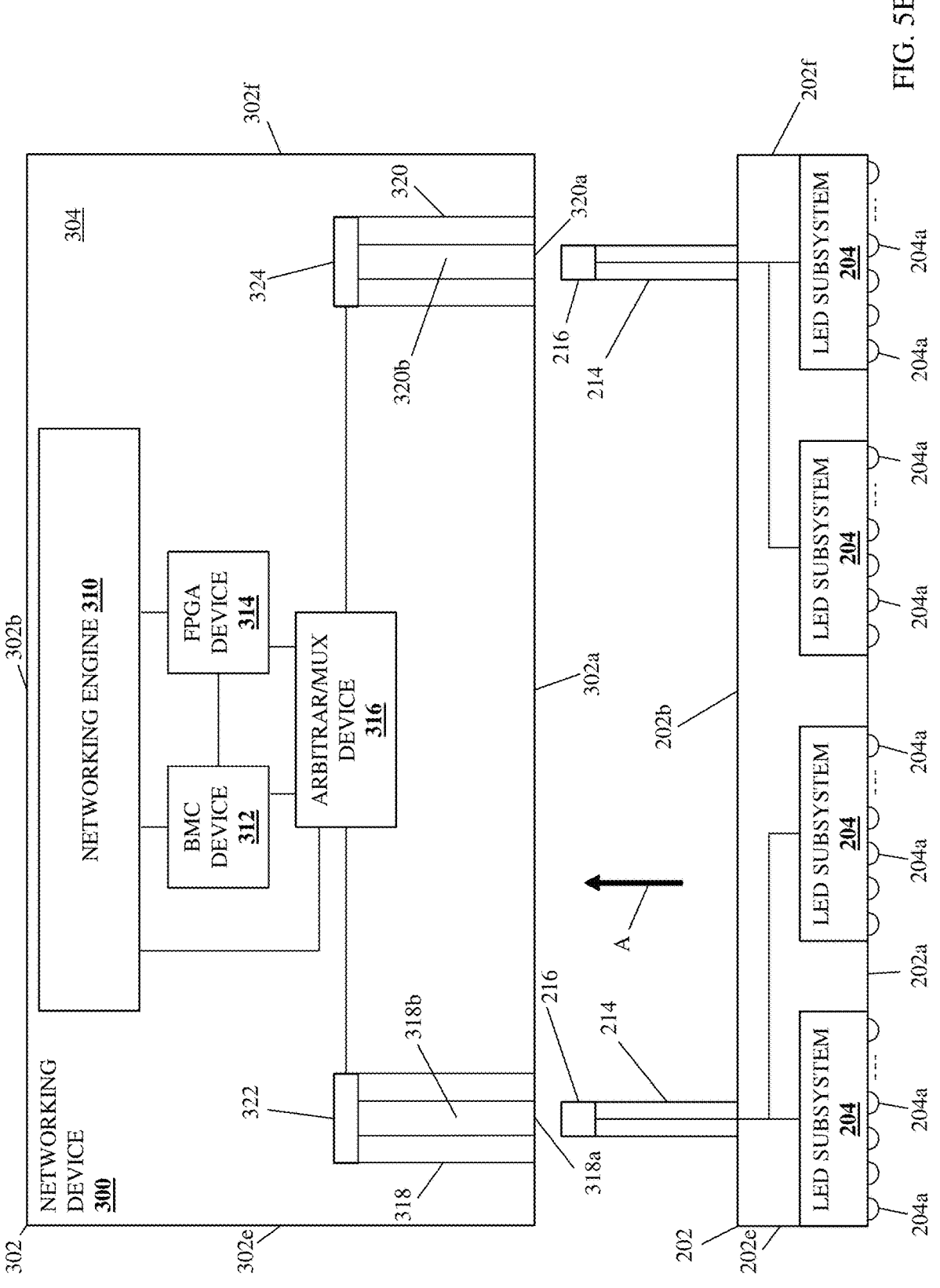
FIG. 5B is a schematic view illustrating an embodiment of the pluggable LED bezel device of FIG. 2A being coupled to the networking device of FIG. 3A.
Figure 6A:
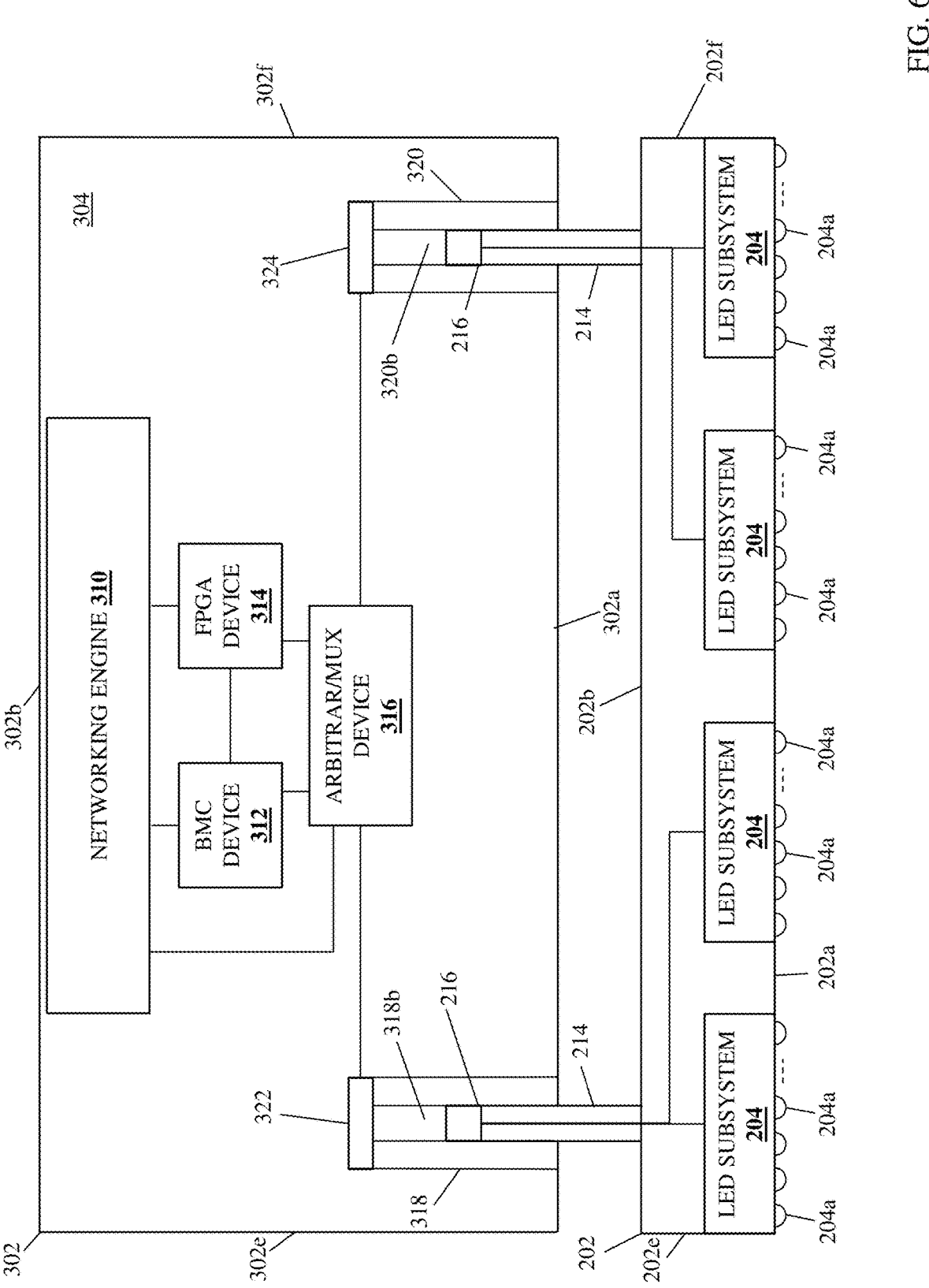
FIG. 6A is a schematic view illustrating an embodiment of the pluggable LED bezel device of FIG. 2A being coupled to the networking device of FIG. 3A.
Figure 6B:
FIG. 6B is a schematic view illustrating an embodiment of the pluggable LED bezel device of FIG. 2A coupled to the networking device of FIG. 3A.

The method 400 begins at block 402 where a pluggable LED bezel device is connected to a computing device such that ports apertures on the pluggable LED bezel device are located immediately adjacent ports on the computing device and a bezel device connector on the pluggable LED bezel device couples to an LED control system in the computing device. With reference to FIGS. 5A and 5B, in an embodiment of block 402, the pluggable LED bezel device 200 may be positioned adjacent the networking device 300 such that the bezel device connectors 216/bezel device guide members 214 are located adjacent and aligned with the bezel device connector slots 318a and 320a on the front wall 302a of the networking device chassis 302. As will be appreciated by one of skill in the art in possession of the present disclosure, block 402 of the method 400 may be performed during initial cabling of the networking device 300, following any port outage of the networking device 300, during cable maintenance for the networking device 300, and/or for any other LED usage scenarios that would be apparent to one of skill in the art in possession of the present disclosure. As such, before block 402, as well as after performance of the method 400, the networking device 300 may be provided without the pluggable LED bezel device 200 and, thus, without the LEDs included thereon.

With reference to FIGS. 5A, 5B, 6A, and 6B, the pluggable LED bezel device 200 may then be moved in a direction A such that the bezel device connectors 216/bezel device guide members 214 enter the bezel device connector slots 318a and 320a on the front wall 302a of the networking device chassis 300, with the bezel device guide members 214 engaging the bezel device connector channels 318b and 320b to guide the bezel device connectors 216 as the pluggable LED bezel device 200 moves in the direction A until the bezel device connectors 216 engage the networking device connectors 322 and 324 to couple the bezel device connectors 216 to the LED control system in the networking device 300 (e.g., the networking engine 310, the BMC device 312, and the FPGA device 314 via the arbitrar/MUX device 316).

As will be appreciated by one of skill in the art in possession of the present disclosure, the engagement of the bezel device connectors 216 with the networking device connectors 322 and 324 operates to connect the pluggable LED bezel device 200 to the networking device 300, and in some embodiments the pluggable LED bezel device 200 may subsequently be secured to the networking device 300 by providing respective fastener devices (e.g., screws) in the aligned bezel device chassis mounting apertures 212 on the bezel device chassis 202 and the networking device chassis mounting apertures 334 on the front wall 302*a* of the networking device chassis 302.

As will be appreciated by one of skill in the art in possession of the present disclosure, the connection of the pluggable LED bezel device 200 to the networking device 300 provides the uplink data ports 328*a* in the uplink data port section 328 on the networking device 300 immediately adjacent to and accessible via the port apertures 208*a* in the uplink data port section 208 of the bezel device chassis 202, the primary data ports 326*a* in each of the primary data port sections 326 on the networking device 300 immediately adjacent to and accessible via the port apertures 206*a* in each of the primary data port sections 206 of the bezel device chassis 202, and the management data ports 330*a* in the management data port section 330 on the networking device 300 immediately adjacent to and accessible via the port apertures 210*a* in the management data port section 210 of the bezel device chassis 202.

Furthermore, one of skill in the art in possession of the present disclosure will also appreciate how the connection of the pluggable LED bezel device 200 to the networking device 300 provides the airflow apertures 328*b* in the uplink data port section 328 on the networking device 300 immediately adjacent to airflow apertures 208*b* in the uplink data port section 208 of the bezel device chassis 202, the airflow apertures 326*b* in each of the primary data port sections 326 on the networking device 300 immediately adjacent to the airflow apertures 206*b* in each of the primary data port sections 206 of the bezel device chassis 202, the airflow apertures 330*b* in the management data port section 330 on the networking device 300 immediately adjacent to the airflow apertures 210*b* in the management data port section 210 of the bezel device chassis 202, the luggage tag 328*c* in the uplink data port section 328 on the networking device 300 immediately adjacent to and accessible via the luggage tag aperture 208*c* in the uplink data port section 208 of the bezel device chassis 202, and the system LEDs 332 in the management data port section 330 on the networking device 300 immediately adjacent and visible through the system LED aperture 210*c* in the management data port section 210 of the bezel device chassis 202.

Figure 7A:
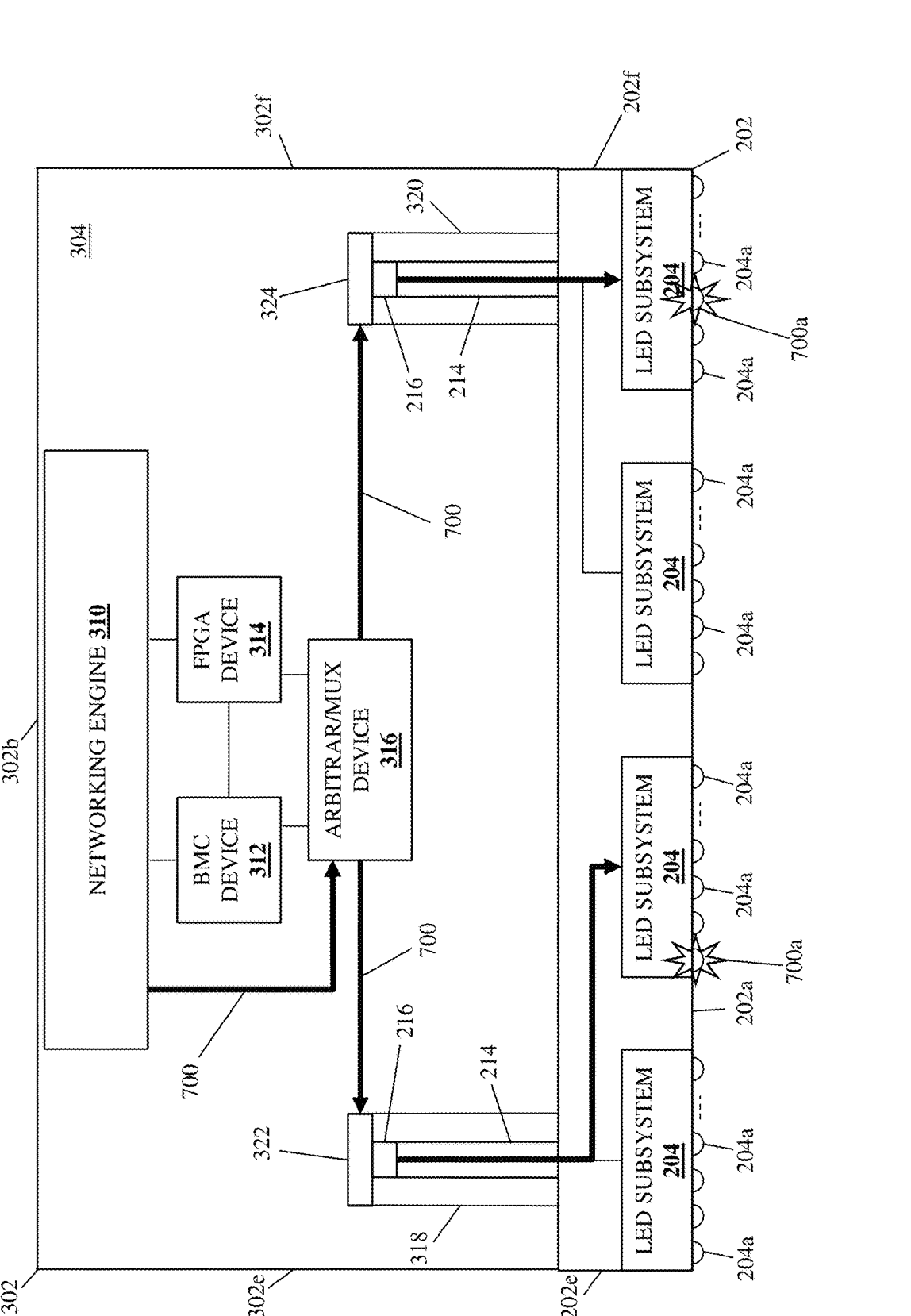
FIG. 7A is a schematic view illustrating an embodiment of the pluggable LED bezel and the networking device of FIG. 6B operating during the method of FIG. 4.

The method 400 then proceeds to block 404 where the bezel device connector transmits LED control information received from the LED control system. With reference to FIG. 7A, in an embodiment of block 404, the networking engine 310 in the LED control system of the networking device 300 may perform LED control information transmission operations 700 that, in the illustrated example, include generating LED control information and transmitting that LED control information to the arbitrar/MUX device 316 to cause the arbitrar/MUX device 316 to provide (e.g., using any of a variety of arbitration or MUX logic that would be apparent to one of skill in the art in possession of the present disclosure) that LED control information to either or both of the networking device connectors 322 and 324 such that the LED control information is received by the bezel device connectors 216 and transmitted to one or more of their connected LED subsystems 204.

Figure 7B:
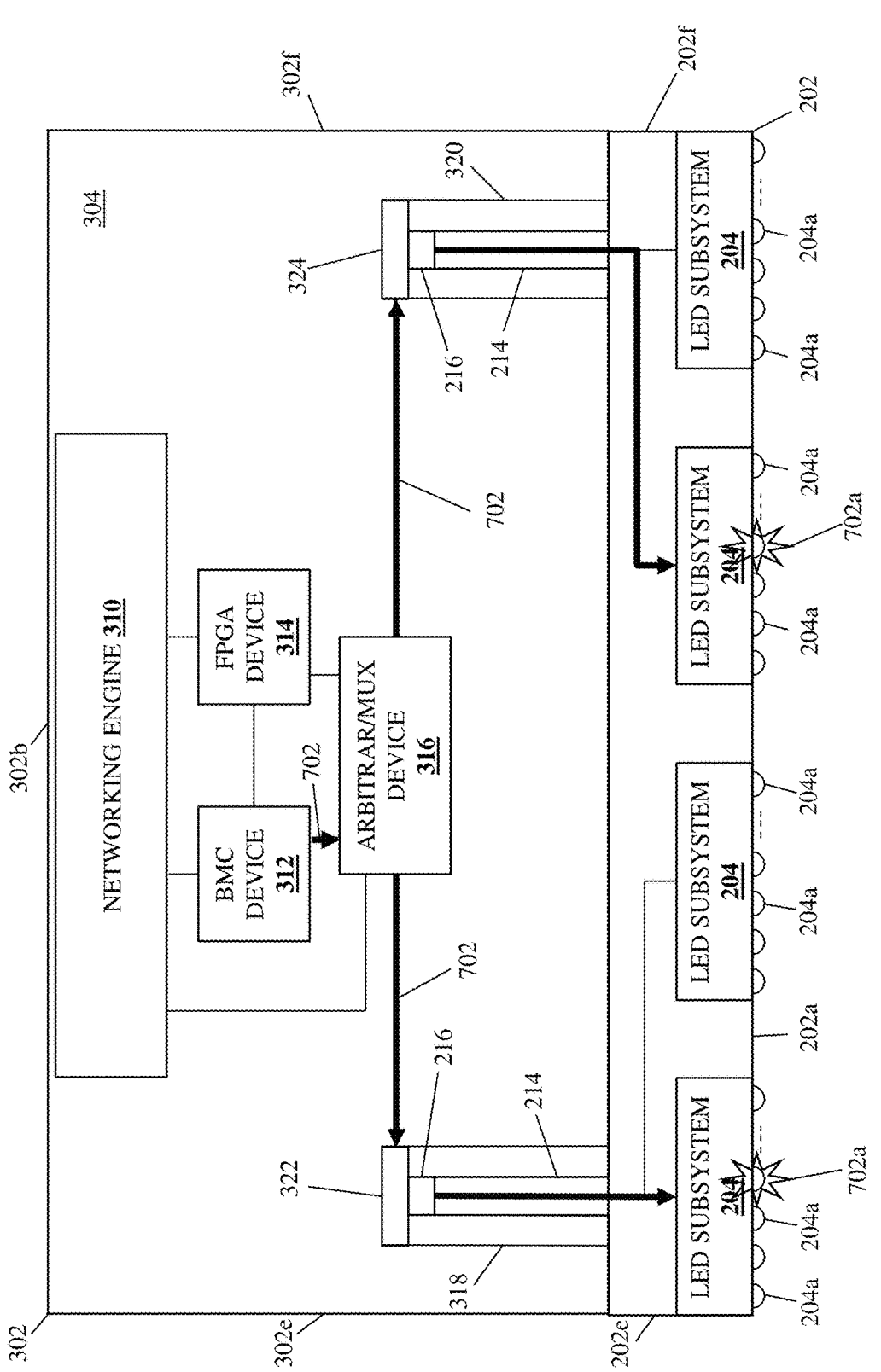
FIG. 7B is a schematic view illustrating an embodiment of the pluggable LED bezel and the networking device of FIG. 6B operating during the method of FIG. 4.

With reference to FIG. 7B, in another embodiment of block 404, the BMC device 312 in the LED control system of the networking device 300 may perform LED control information transmission operations 702 that, in the illustrated example, include generating LED control information and transmitting that LED control information to the arbitrar/MUX device 316 to cause the arbitrar/MUX device 316 to provide (e.g., using any of a variety of arbitration or MUX logic that would be apparent to one of skill in the art in possession of the present disclosure) that LED control information to either or both of the networking device connectors 322 and 324 such that the LED control information is received by the bezel device connectors 216 and transmitted to one or more of their connected LED subsystems 204.

Figure 7C:
FIG. 7C is a schematic view illustrating an embodiment of the pluggable LED bezel and the networking device of FIG. 6B operating during the method of FIG. 4.

With reference to FIG. 7C, in another embodiment of block 404, the FPGA device 314 in the LED control system of the networking device 300 may perform LED control information transmission operations 704 that, in the illustrated example, include generating LED control information and transmitting that LED control information to the arbitrar/MUX device 316 to cause the arbitrar/MUX device 316 to provide (e.g., using any of a variety of arbitration or MUX logic that would be apparent to one of skill in the art in possession of the present disclosure) that LED control information to either or both of the networking device connectors 322 and 324 such that the LED control information is received by the bezel device connectors 216 and transmitted to one or more of their connected LED subsystems 204. As such, one of skill in the art in possession of the present disclosure will appreciate how the arbitrar/MUX device 316 may be configured to arbitrate between the networking engine 310, the BMC device 312, and the FPGA device 314 that operate as "masters" that may select the channels available via the arbitrar/MUX device 316 to the LED subsystems 204.

As will be appreciated by one of skill in the art in possession of the present disclosure, the LED control information may be configured to illuminate LEDs for the purposes of providing beacon/locator functionality, during initial cabling of the networking device 300, following any port outage of the networking device 300, during cable maintenance for the networking device 300, and/or for any other LED illumination situations that would be apparent to one of skill in the art in possession of the present disclosure. Furthermore, while the LED control information is illustrated and described as being provided to two bezel device connectors, as discussed above a single bezel device connector may be provided on the pluggable LED bezel device 200 and/or may otherwise receive the LED control information at block 404 while remaining within the scope of the present disclosure as well.

The method 400 then proceeds to block 406 where LEDs on the pluggable LED bezel device illuminate based on the LED control information transmitted by the bezel device connector. With reference back to FIG. 7A, in an embodiment of block 406 and in response to the bezel device connectors 216 transmitting the LED control information at block 404, a subset of LEDs on the LED subsystems 204 may illuminate (as indicated by the elements 700*a* in FIG. 7A). Similarly, with reference back to FIG. 7B, in an embodiment of block 406 and in response to the bezel device connectors 216 transmitting the LED control information at block 404, a subset of LEDs on the LED subsystems 204 may illuminate (as indicated by the elements 702*a* in FIG. 7B). Similarly, with reference back to FIG. 7C, in an embodiment of block 406 and in response to the bezel device connectors 216 transmitting the LED control information at block 404, a subset of LEDs on the LED subsystems 204 may illuminate (as indicated by the elements 704*a* in FIG. 7C).

As will be appreciated by one of skill in the art in possession of the present disclosure, while the examples provided in FIGS. 7A-7C each illustrate a pair of LEDs being illuminated, any number of LEDs may be illuminated at block 406 based any LED illumination situation while remaining within the scope of the present disclosure. For example, the illumination of the LEDs 204*a* on the LED subsystems 204 at block 406 may include illuminating each of the LEDs provided about the perimeter of a port aperture on the pluggable LED bezel device in order to provide a beacon for and/or otherwise facilitate locating the port immediately adjacent that port aperture. Similarly, the illumination of the LEDs 204*a* on the LED subsystems 204 at block 406 may include illuminating the LED that provides a backlight for a port number on the bezel device chassis that is adjacent a port aperture on the pluggable LED bezel device in order to provide a beacon for and/or otherwise facilitate locating the port immediately adjacent that port aperture and port number. Similarly, the illumination of the LEDs 204*a* on the LED subsystems 204 at block 406 may include illuminating all (or a subset of) LEDs provided about the perimeter of the port apertures on the pluggable LED bezel device in a pattern, with particular colors, and/or in other manner that one of skill in the art in possession of the present disclosure would appreciate as providing networking device beacon/locator functionality that facilitates the locating of the networking device.

As will be appreciated by one of skill in the art in possession of the present disclosure, the pluggable LED bezel device 200 may remain connected to the networking device 300 for as long as desired by a user of the networking device 300. However, when the user of the networking device 300 no longer desires to have the pluggable LED bezel device 200 connected to the networking device 300 (e.g., because the LED situation for which the pluggable LED bezel device 200 was used has ended, in order to use the pluggable LED bezel device 200 with another networking device, etc.), that user may disconnect the pluggable LED bezel device 200 from the networking device 300 by removing the respective fastener devices (e.g., screws) from the aligned bezel device chassis mounting apertures 212 on the bezel device chassis 202 and the networking device chassis mounting apertures 334 on the front wall 302*a* of the networking device chassis 302 (when present), and then move the pluggable LED bezel device 200 opposite the direction A (illustrated in FIGS. 5A and 5B) in order to disconnect the bezel device connectors 216 from the networking device connectors 322 and 324 and allow the bezel device guide members 214 to move through the bezel device connector channels 318*b* and 320*b*, respectively, on the networking device guide members 318 and 320, respectively, and out of the bezel device connector slots 318*a* and 320*a*, respectively.

Thus, systems and methods have been described that provide a pluggable LED bezel device that may be connected to a networking device to provide the LEDs for that networking device adjacent corresponding ports on that networking device, and then disconnected from that networking device when those LEDs are not needed. For example, the pluggable LED bezel device of the present disclosure may include a bezel device chassis that defines a plurality of port apertures and that is configured to connect to a computing device such that each of the plurality of port apertures is located immediately adjacent a respective port included on the computing device. A plurality of LEDs are included on the bezel device chassis. At least one bezel device connector extends from the bezel device chassis and is configured to couple to an LED control system in the computing device when the bezel device chassis is connected to the computing device, and transmit LED control information received from the LED control system to cause at least one of the plurality of LEDs to illuminate. As such, LEDs may be removed from networking devices to open up space for other networking device features (e.g., airflow apertures), eliminate the time required to develop and test networking-device-integrated LED subsystems, and provide other benefits that would be apparent to one of skill in the art in possession of the present disclosure.

As such, the pluggable LED bezel system of the present disclosure includes a pluggable LED bezel device that provides LED subsystems for a networking device that are software driven and not tied to the manufacturing process of the networking device, eliminating much of the time and effort conventionally dedicated to designing LED subsystems for the networking device (both from a hardware perspective as well as a software/controller code development and testing perspective), and allowing the bezel device chassis and its LED subsystem to be finalized after the initial product design of the networking device. As will be appreciated by one of skill in the art in possession of the present disclosure, the pluggable LED bezel device is optional for use with any networking device, particular with regard to Open Network Install Environment (ONIE) hardware requirements that do not make LEDs mandatory, and allows LEDs to be provided on networking devices as an add-on and/or on an as-needed basis. Furthermore, the disaggregation of the LEDs from the networking device via the pluggable LED bezel device is relatively highly customizable, and allows users to adapt LED usage to their needs while reducing the use of resources associated with networking device hardware, software, manufacturing, and technical assistance.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A pluggable Light Emitting Device (LED) bezel device, comprising:
    a bezel device chassis that defines a plurality of port apertures and that is configured to connect to a computing device such that each of the plurality of port apertures is located immediately adjacent a respective port included on the computing device;
    a plurality of Light Emitting Devices (LEDs) that are included on the bezel device chassis; and
    at least one bezel device connector that extends from the bezel device chassis and that is configured to:
        couple to an LED control system in the computing device when the bezel device chassis is connected to the computing device; and
        transmit LED control information received from the LED control system to cause at least one of the plurality of LEDs to illuminate.

2. The system of claim 1, wherein the plurality of LEDs include at least one port LED located on the bezel device chassis in association with each of the plurality of port apertures in order to indicate information about the respective port located immediately adjacent that port aperture when the bezel device chassis is connected to the computing device and that at least one port LED is illuminated.

3. The system of claim 1, wherein each of the plurality of port apertures includes a plurality of the ports LEDs positioned about a perimeter of that port aperture.

4. The system of claim 1, wherein the LED control information received from the LED control system is configured to cause at least one of the plurality of LEDs to illuminate to provide beacon/locator functionality.

5. The system of claim 1, further comprising:

a bezel device guide subsystem that extends from the bezel device chassis and that is configured to engage a computing device guide system on the computing device to guide the at least one bezel device connector into engagement with a respective computing device connector on the computing device in order to couple the at least one bezel device connector to the LED control system when the bezel device chassis is connected to the computing device.

6. The system of claim 1, wherein the at least one bezel device connector is included on the bezel device guide subsystem.

7. The system of claim 1, wherein the bezel device chassis defines a plurality of bezel device chassis airflow apertures that are configured to be located immediately adjacent corresponding computing device airflow apertures defined by the computing device when the bezel device chassis is connected to the computing device.

8. An Information Handling System (IHS), comprising:

an Information Handling System (IHS) chassis;

a communication system in the IHS chassis that includes a plurality of ports that are accessible on a surface of the IHS chassis;

a processing system in the IHS chassis that is coupled to the communication system;

a memory system in the IHS chassis that is coupled to the processing system and that includes instructions that, when executed by the processing system, cause the processing system to provide a Light Emitting Device (LED) control engine;

a bezel device chassis that is connected to the IHS chassis and that defines a plurality of port apertures that are each located immediately adjacent a respective one of the plurality of ports, wherein the bezel device chassis is configured to be disconnected from the IHS chassis;

a plurality of LEDs that are included on the bezel device chassis; and at least one bezel device connector that extends from the bezel device chassis, that is coupled to the processing system, and that is configured to transmit LED control information received from the LED control engine to cause at least one of the plurality of LEDs to illuminate, wherein the at least one bezel device connector is configured to be decoupled from the processing system when the bezel device chassis is disconnected from the IHS chassis.

9. The IHS of claim 8, wherein the plurality of LEDs include at least one port LED located on the bezel device chassis in association with each of the plurality of port apertures in order to indicate information about the respective port located immediately adjacent that port aperture when that at least one port LED is illuminated.

10. The IHS of claim 8, wherein the LED control information received from the LED control engine is configured to cause at least one of the plurality of LEDs to illuminate to provide beacon/locator functionality.

11. The IHS of claim 8, further comprising:

an IHS guide subsystem that is included on the IHS chassis; and a bezel device guide subsystem that extends from the bezel device chassis and that engages the IHS guide subsystem, wherein the engagement of the bezel device guide subsystem and the IHS guide subsystem is configured to guide the at least one bezel device connector into engagement with a respective IHS connector on the IHS chassis in order to couple the at least one bezel device connector to the processing system when the bezel device chassis is connected to the IHS chassis.

12. The IHS of claim 11, wherein the at least one bezel device connector is included on the bezel device guide subsystem.

13. The IHS of claim 8, wherein the bezel device chassis defines a plurality of bezel device chassis airflow apertures that are located immediately adjacent corresponding IHS chassis airflow apertures defined by the IHS chassis when the bezel device chassis is connected to the IHS chassis.

14. A method for providing device information using a pluggable Light Emitting Device (LED) bezel device, comprising:

connecting, by a bezel device chassis that defines a plurality of port apertures, to a computing device such that each of the plurality of port apertures is located immediately adjacent a respective port included on the computing device;

coupling, by at least one bezel device connector that extends from the bezel device chassis in response to the bezel device chassis being connected to the computing device, to an LED control system in the computing device;

transmitting, by the at least one bezel device connector, LED control information received from the LED control system; and illuminating, by at least one of a plurality of Light Emitting Devices (LEDs) that are included on the bezel device chassis, based on the LED control information transmitted by the at least one bezel device connector.

15. The method of claim 14, wherein the plurality of LEDs include at least one port LED located on the bezel device chassis in association with each of the plurality of port apertures in order to indicate information about the respective port located immediately adjacent that port aperture when that at least one port LED is illuminated.

16. The method of claim 14, wherein each of the plurality of port apertures includes a plurality of the ports LEDs positioned about a perimeter of that port aperture.

17. The method of claim 14, wherein the LED control information received from the LED control system is configured to cause at least one of the plurality of LEDs to illuminate to provide beacon/locator functionality.

18. The method of claim 14, further comprising:

engaging, by a bezel device guide subsystem that extends from the bezel device chassis, a computing device guide system on the computing device to guide the at least one bezel device connector into engagement with a respective computing device connector on the computing device in order to couple the at least one bezel device connector to the LED control system in response to the bezel device chassis being connected to the computing device.

19. The method of claim 18, wherein the at least one bezel device connector is included on the bezel device guide subsystem.

20. The method of claim 14, wherein the bezel device chassis defines a plurality of bezel device chassis airflow apertures that are located immediately adjacent corresponding computing device airflow apertures defined by the computing device in response to the bezel device chassis being connected to the computing device.

\* \* \* \* \*